(12) United States Patent
Fujii et al.

(10) Patent No.: US 11,751,478 B2
(45) Date of Patent: Sep. 5, 2023

(54) METHOD OF MANUFACTURING POWER GENERATION ELEMENT, POWER GENERATION ELEMENT, AND POWER GENERATION APPARATUS

(71) Applicant: FUJIFILM CORPORATION, Tokyo (JP)

(72) Inventors: Takamichi Fujii, Kanagawa (JP); Kenichi Umeda, Kanagawa (JP)

(73) Assignee: FUJIFILM CORPORATION, Tokyo (JP)

(*) Notice: Subject to any disclaimer, the term of this patent is extended or adjusted under 35 U.S.C. 154(b) by 554 days.

(21) Appl. No.: 16/841,703

(22) Filed: Apr. 7, 2020

(65) Prior Publication Data
US 2020/0235284 A1   Jul. 23, 2020

Related U.S. Application Data

(63) Continuation of application No. PCT/JP2018/034687, filed on Sep. 19, 2018.

(30) Foreign Application Priority Data

Oct. 12, 2017   (JP) ................. 2017-198384

(51) Int. Cl.
*H01L 41/113* (2006.01)
*H02N 2/18* (2006.01)
(Continued)

(52) U.S. Cl.
CPC ............ *H10N 30/088* (2023.02); *H02N 2/18* (2013.01); *H10N 30/07* (2023.02); *H10N 30/30* (2023.02); *H10N 30/872* (2023.02); *H10N 30/88* (2023.02)

(58) Field of Classification Search
CPC ... H01L 41/053; H01L 41/113; H01L 41/1136
(Continued)

(56) References Cited

U.S. PATENT DOCUMENTS

| 2009/0045700 | A1* | 2/2009 | Sasaki .................. H01L 41/094 310/348 |
| 2013/0127295 | A1* | 5/2013 | Jun ....................... H02N 2/188 977/948 |

(Continued)

FOREIGN PATENT DOCUMENTS

| JP | H11-211748 A | 8/1999 |
| JP | 2009-10270 A | 1/2009 |

(Continued)

OTHER PUBLICATIONS

English language translation of the following: Office action dated Apr. 27, 2021 from the JPO in a Japanese patent application No. 2019-547965 corresponding to the instant patent application.
(Continued)

*Primary Examiner* — Derek J Rosenau
(74) *Attorney, Agent, or Firm* — SOLARIS Intellectual Property Group, PLLC

(57) ABSTRACT

A method of manufacturing a power generation element includes a first step of disposing a support unit that supports a vibration unit in one end portion of the vibration unit in one direction, and disposing a weight unit in the other end portion of the vibration unit in the one direction in a substrate including the vibration unit capable of vibrating, a second step of disposing a piezoelectric unit that generates power due to vibration in a portion of the vibration unit on an opposite side from the support unit side in a thickness direction of the substrate after the support unit and the weight unit are disposed in the vibration unit, and a third step of extracting a power generation element from the substrate by cutting an outer edge of the vibration unit in the thickness (Continued)

direction of the substrate after the piezoelectric unit is disposed in the vibration unit.

1 Claim, 8 Drawing Sheets

(51) Int. Cl.
*H10N 30/088* (2023.01)
*H10N 30/07* (2023.01)
*H10N 30/30* (2023.01)
*H10N 30/88* (2023.01)
*H10N 30/87* (2023.01)

(58) Field of Classification Search
USPC .......................................... 310/328, 339, 348
See application file for complete search history.

(56) References Cited

U.S. PATENT DOCUMENTS

| | | | | |
|---|---|---|---|---|
| 2013/0313946 | A1* | 11/2013 | Lee | ........................ H01L 41/04 29/25.35 |
| 2014/0327339 | A1 | 11/2014 | Katsumura et al. | |
| 2016/0134204 | A1* | 5/2016 | Al Ahmad | ............. H02N 2/181 310/319 |

FOREIGN PATENT DOCUMENTS

| | | |
|---|---|---|
| JP | 2010-259160 A | 11/2010 |
| JP | 2012-60816 A | 3/2012 |
| JP | 2013-172523 A | 9/2013 |
| JP | 2014-20869 A | 2/2014 |
| JP | 2014-230426 A | 12/2014 |
| JP | 2015-220921 A | 12/2015 |
| WO | 2013/121759 A1 | 8/2013 |

OTHER PUBLICATIONS

English language translation of the following: Office action dated Oct. 5, 2021 from the JPO in a Japanese patent application No. 2019-547965 corresponding to the instant patent application. This office action translation is submitted now in order to supplement the understanding of the cited references which are being disclosed in the instant Information Disclosure Statement.

International Search Report issued in International Application No. PCT/JP2018/034687 dated Nov. 27, 2018.

Written Opinion of the ISA issued in International Application No. PCT/JP2018/034687 dated Nov. 27, 2018.

\* cited by examiner

| THICKNESS OF VIBRATION PLATE | 20 μm | 50 μm | 100 μm | 120 μm |
|---|---|---|---|---|
| WARPING EVALUATION | A | B | B | C |

METHOD OF MANUFACTURING POWER GENERATION ELEMENT, POWER GENERATION ELEMENT, AND POWER GENERATION APPARATUS

CROSS-REFERENCE TO RELATED APPLICATION

The present application is a continuation application of International Application No. PCT/JP2018/034687, filed Sep. 19, 2018, which claims priority to Japanese Patent Application No. 2017-198384, filed Oct. 12, 2017. The contents of these applications are incorporated herein by reference in their entirety.

BACKGROUND

Field of the Invention

The present disclosure relates to a method of manufacturing a power generation element, a power generation element, and a power generation apparatus.

Related Art

In a power generation apparatus in JP2014-230426A, a cantilever unit that is cantilevered is formed by forming a slit in a substrate. A frame-shaped support unit is formed around the cantilever unit.

In a vibration power generation apparatus in JP2013-172523A, a support unit, a cantilever unit, and a weight unit are formed by etching an element formation substrate. The weight unit is surrounded by a frame constituting the support unit.

In a power generation element in which a piezoelectric unit is disposed in a vibration unit of a substrate and power is generated by displacing the piezoelectric unit by vibration of the vibration unit, the vibration unit is likely to vibrate as the thickness of the vibration unit is decreased. However, in a case where the piezoelectric unit is disposed in the vibration unit, the vibration unit is likely to warp as the thickness of the vibration unit is decreased.

In the power generation apparatus in JP2014-230426A and the vibration power generation apparatus in JP2013-172523A, the frame is disposed in the vibration unit. Thus, the vibration unit is unlikely to warp. However, by disposing the frame in the vibration unit, the power generation element becomes larger than the single vibration unit. Thus, in a configuration in which the frame is disposed in the vibration unit, the number of power generation elements acquired from the substrate including the vibration unit is decreased.

SUMMARY

The present disclosure is conceived in view of the above matter. An object of the present disclosure is to provide a method of manufacturing a power generation element, a power generation element, and a power generation apparatus capable of decreasing the thickness of a vibration unit and increasing the number of power generation elements acquired from a substrate compared to a method of manufacturing the power generation element by disposing a frame in the vibration unit.

A method of manufacturing a power generation element according to a first aspect of the present disclosure comprises a first step of disposing a support unit that supports a vibration unit in one end portion of the vibration unit in one direction, and disposing a weight unit in the other end portion of the vibration unit in the one direction in a substrate including the vibration unit capable of vibrating, a second step of disposing a piezoelectric unit that generates power due to vibration in a portion of the vibration unit on an opposite side from the support unit side in a thickness direction of the substrate after the support unit and the weight unit are disposed in the vibration unit, and a third step of extracting a power generation element from the substrate by cutting an outer edge of the vibration unit in the thickness direction of the substrate after the piezoelectric unit is disposed in the vibration unit.

The term "step" in the present specification is not limited to an independent step. Even in a case where a step may not be clearly distinguished from another step, the step is included in the present term as long as an initial purpose of the step is accomplished.

The method of manufacturing a power generation element according to a second aspect of the present disclosure may further comprise a step of extracting the support unit and the weight unit as a single unit from one base material, in which in the first step, the support unit and the weight unit extracted from the base material are disposed in the vibration unit, and in the third step, the support unit and the weight unit disposed in the vibration unit are divided by cutting the outer edge of the vibration unit.

In the method of manufacturing a power generation element according to a third aspect of the present disclosure, the support unit and the weight unit may be formed by bonding a plurality of plate materials in an overlapping manner in the thickness direction of the substrate.

In the method of manufacturing a power generation element according to a fourth aspect of the present disclosure, the support unit and the weight unit may be formed by thermally compressing or diffusion bonding the plate materials made of metal in the thickness direction.

A power generation element according to a fifth aspect of the present disclosure comprises a vibration plate that is formed to be deformable in a thickness direction and in which side surfaces in a longitudinal direction and a transverse direction intersecting with the thickness direction are exposed, a support unit that is disposed from one end to the other end of the transverse direction in one end portion of the vibration plate in the longitudinal direction and supports the vibration plate, a piezoelectric unit that is disposed in a portion of the vibration plate on an opposite side from the support unit side in the thickness direction and generates power due to vibration of the vibration plate, and a weight unit that is disposed from one end to the other end of the transverse direction in the other end portion of the vibration plate in the longitudinal direction.

In the power generation element according to a sixth aspect of the present disclosure, a thickness of the vibration plate may be greater than or equal to 10 μm and less than or equal to 100 μm.

In the power generation element according to a seventh aspect of the present disclosure, the weight unit may include a plurality of plate materials overlapping in the thickness direction.

In the power generation element according to an eighth aspect of the present disclosure, the support unit may include a plurality of the plate materials overlapping in the thickness direction.

In the power generation element according to a ninth aspect of the present disclosure, the support unit and the weight unit may be disposed on a surface of the vibration plate on an opposite side from the piezoelectric unit side in the thickness direction, and a reinforcing unit that reinforces the vibration plate may be disposed on a surface of the vibration plate between the support unit and the weight unit.

A power generation apparatus according to a tenth aspect of the present disclosure comprises the power generation element according to any one of the fifth aspect to the ninth aspect, a circuit substrate in which an attachment unit to which the support unit is attached is disposed, an accommodation member that is formed in a hollow box shape, is disposed in the circuit substrate, and accommodates the power generation element inside the accommodation member, and a contact member that is accommodated between the power generation element and the circuit substrate inside the accommodation member and comes into contact with the vibration plate.

In the power generation apparatus according to an eleventh aspect of the present disclosure, the contact member may be formed in a spherical shape and is arranged between the support unit and the weight unit, and a length of a diameter of the contact member may be greater than a length of an interval between the circuit substrate and the weight unit.

According to the present disclosure, a method of manufacturing a power generation element, a power generation element, and a power generation apparatus capable of decreasing the thickness of a vibration unit and increasing the number of power generation elements acquired from a substrate compared to a method of manufacturing the power generation element by disposing a frame in the vibration unit may be provided.

DETAILED DESCRIPTION

First Embodiment

Hereinafter, one example of a method of manufacturing a power generation element, a power generation element, and a power generation apparatus according to the present disclosure will be described.

Figure 1:
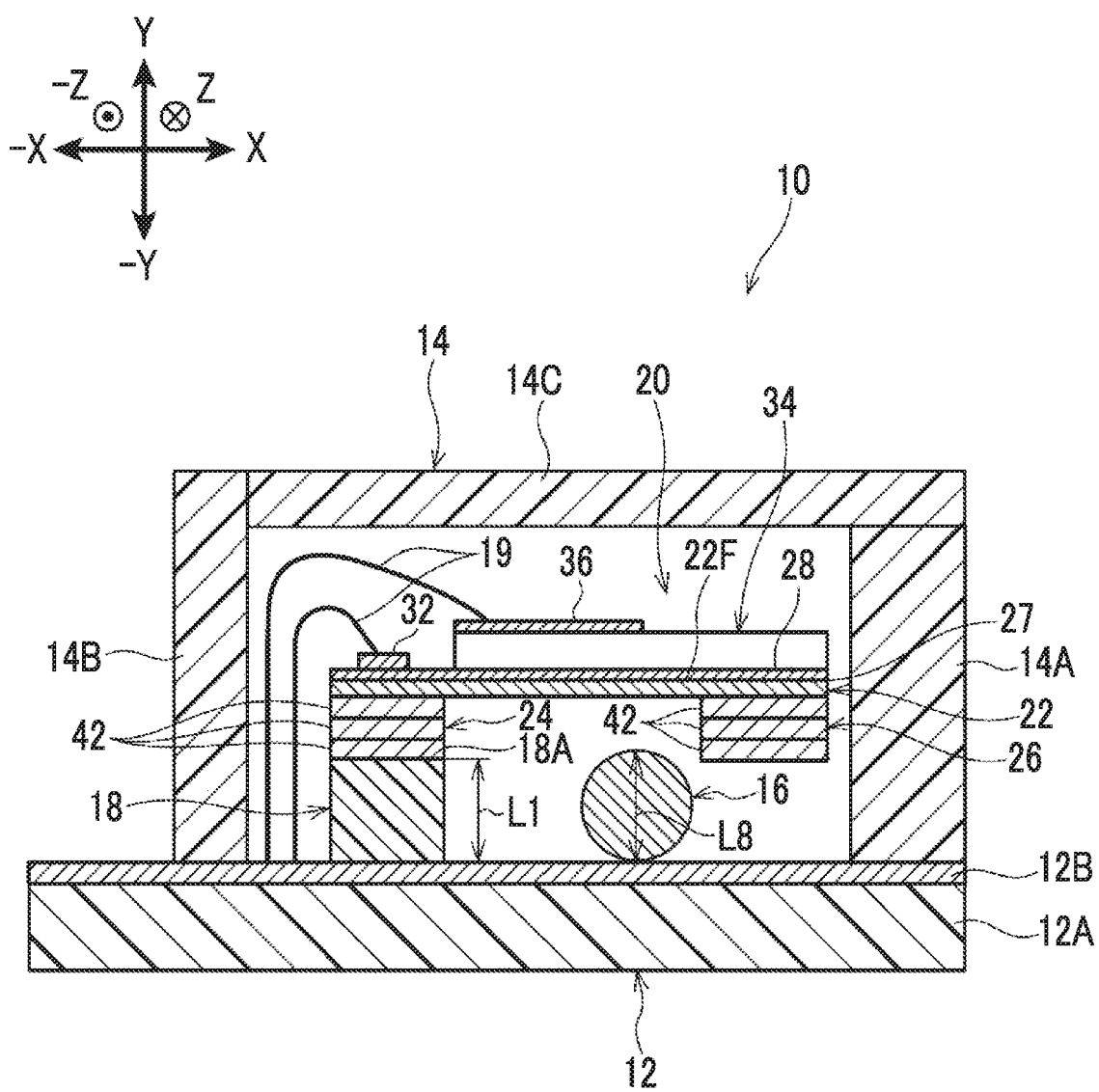
FIG. 1 is a configuration diagram of a power generation apparatus according to a first embodiment.

FIG. 1 illustrates a power generation apparatus 10 as a first embodiment of the present disclosure. For example, the power generation apparatus 10 includes a power generation element 20, a circuit substrate 12, a cover member 14 as one example of an accommodation member, a ball member 16 as one example of a contact member formed in a spherical shape, a support 18 as one example of an attachment unit, and a bonding wire 19 made of gold (Au).

In the following description, a thickness direction of the circuit substrate 12 will be referred to as a Y direction. In addition, a direction that is orthogonal to the Y direction and is a longitudinal direction of the power generation element 20 will be referred to as an X direction. Furthermore, a direction that is orthogonal to the X direction and the Y direction and is a transverse direction of the power generation element 20 will be referred to as a Z direction. For example, the Y direction follows a gravity direction. In the power generation apparatus 10, in a case where it is necessary to distinguish one side and the other side of each of the X direction, the Y direction, and the Z direction with respect to the center thereof, the one side will be referred to as an X side, a Y side, or a Z side, and the other side will be referred to as a −X side, a −Y side, or a −Z side.

Circuit Substrate

The circuit substrate 12 includes a substrate main body 12A extending along an X-Z plane and a wiring pattern 12B formed on a Y side surface (upper surface) of the substrate main body 12A. In the upper surface of the substrate main body 12A, the support 18 described later is disposed in a part of a portion in which the wiring pattern 12B is not formed. In FIG. 1, the circuit substrate 12 is arranged on the −Y side (lower side) of the power generation element 20. Alternatively, the circuit substrate 12 may be arranged not to overlap with the power generation element 20 (the circuit substrate 12 may be arranged away from the power generation element 20 in the X direction) in a case where the circuit substrate 12 is seen from the Y direction. In a case where the circuit substrate 12 is arranged away from the power generation element 20 in the X direction, a substrate and the like as a pedestal may be arranged on a lower surface of the power generation element 20. Hereinafter, as one example of the power generation apparatus 10, the circuit substrate 12 will be described as being arranged on the lower surface of the power generation element 20.

Support

The support 18 is erected in the Y direction on an upper surface of the circuit substrate 12. In addition, in a case where the support 18 is seen from the Y direction, the support 18 is formed in a rectangular parallelepiped shape that has a rectangular upper surface 18A having the Z direction as a longitudinal direction and the X direction as a transverse direction. For example, the support 18 is made of resin. A support unit 24 of the power generation element 20 described later is attached to the upper surface 18A. A length corresponding to the height of the support 18 in the Y direction is denoted by L1. The length L1 corresponds to the length of an interval between the circuit substrate 12 and a weight unit 26 described later.

Cover Member

The cover member 14 is disposed on the Y side of the circuit substrate 12 and covers the upper surface of the circuit substrate 12 from the Y side. In addition, the cover member 14 includes a side wall 14A erected in the Y direction on the X side of the circuit substrate 12, a side wall 14B erected in the Y direction on the –X side of the circuit substrate 12, side walls, not illustrated, erected in the Y direction on the Z side and the –Z side of the circuit substrate 12, and an upper wall 14C. The upper wall 14C covers the circuit substrate 12 by connecting a Y side end portion of the side wall 14A, a Y side end portion of the side wall 14B, and Y side end portions of the side walls, not illustrated. In other words, the cover member 14 is formed in a hollow box shape that is open on the –Y side. The cover member 14 accommodates the power generation element 20 described later inside the cover member 14.

Power Generation Element

For example, the power generation element 20 includes a vibration plate 22, the support unit 24, the weight unit 26, a base unit 27, a lower electrode 28, a pad 32, a piezoelectric unit 34, and an upper electrode 36. In addition, the power generation element 20 is enabled to supply power to the circuit substrate 12 by connecting the pad 32 and a pad, not illustrated, of the circuit substrate 12 through the bonding wire 19. A ratio of thickness of each part illustrated in the drawings is appropriately changed for convenience of description and may not reflect the actual ratio of thickness.

Vibration Plate

The vibration plate 22 illustrated in FIG. 1 is one example of a vibration unit and is configured with a plate material having the Y direction as a thickness direction. In addition, for example, the vibration plate 22 is made of SUS430 (stainless steel). In other words, the vibration plate 22 is formed to be capable of deforming (vibrating) in the Y direction. In a case where the thickness of the vibration plate 22 is set within a manufacturable range, the thickness of the vibration plate 22 is greater than or equal to 10 μm. In addition, it is preferable to set the thickness of the vibration plate 22 to be less than or equal to 100 μm from the viewpoint of achieving vibration necessary for power generation. In the present embodiment, for example, the thickness of the vibration plate 22 is set to 20 μm.

Figure 2A:
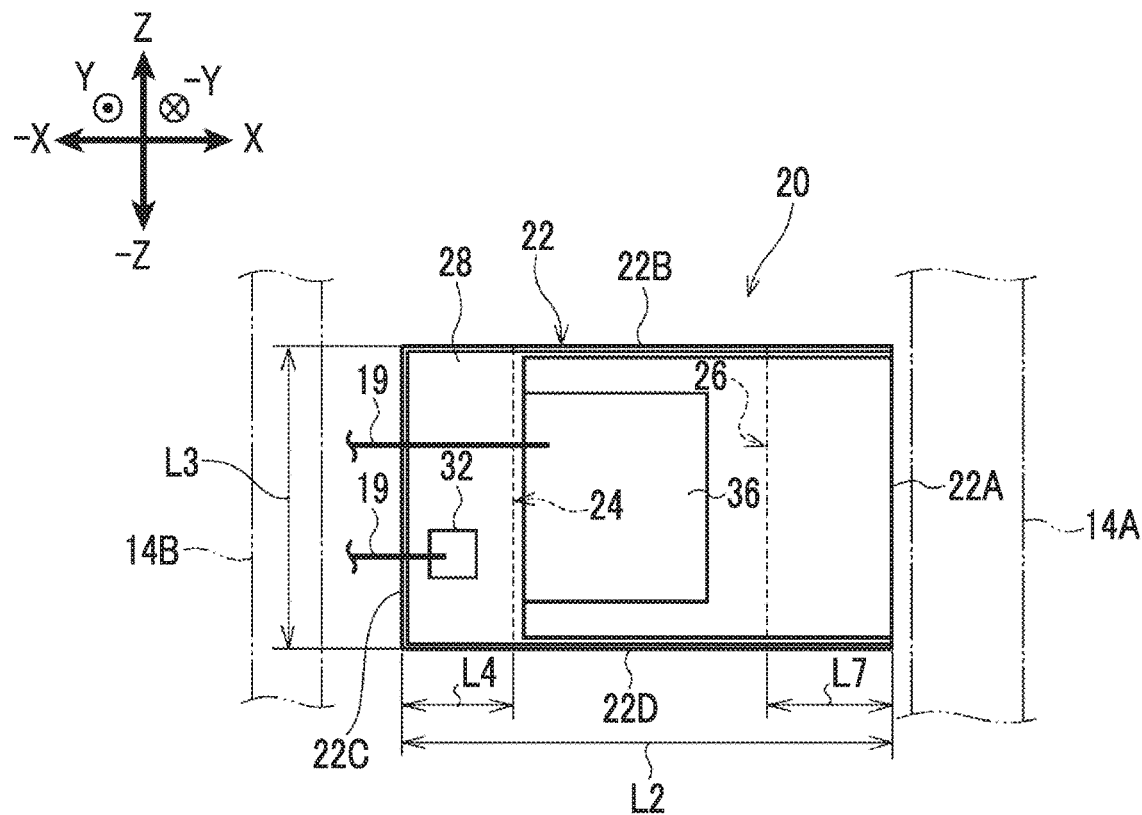
FIG. 2A is a plan view of a power generation element according to the first embodiment.

In a case where the vibration plate 22 illustrated in FIG. 2A is seen from the Y direction, the vibration plate 22 is formed in a rectangular shape having the X direction as a longitudinal direction and the Z direction as a transverse direction. In addition, the vibration plate 22 has a side surface 22A on the X side, a side surface 22B on the Z side, a side surface 22C on the –X side, and a side surface 22D on the –Z side. Each of the side surface 22A, the side surface 22B, the side surface 22C, and the side surface 22D is exposed. In other words, in a case where the vibration plate 22 is seen from the Y direction, other members are not disposed on an outer side of the vibration plate 22. The length of the vibration plate 22 in the X direction is denoted by L2, and the length of the vibration plate 22 in the Z direction is denoted by L3. A –Y side (a support unit 24 side and a weight unit 26 side) surface of the vibration plate 22 illustrated in FIG. 1 will be referred to as a lower surface 22E (refer to FIG. 3C), and a Y side (a piezoelectric unit 34 side) surface of the vibration plate 22 will be referred to as an upper surface 22F.

Figure 2B:
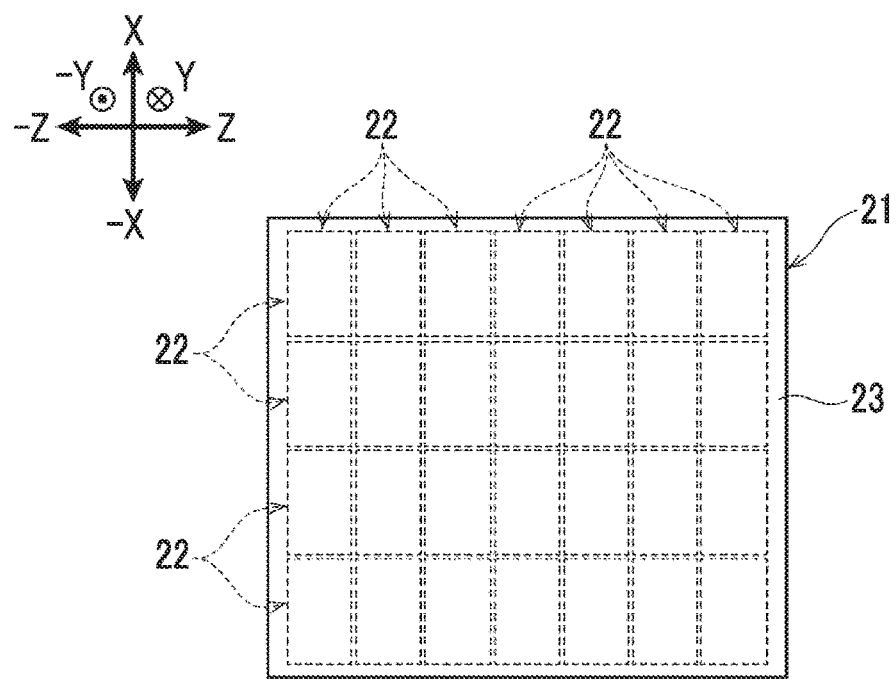
FIG. 2B is a plan view of a substrate according to the first embodiment.

FIG. 2B illustrates a substrate 21 before a plurality of vibration plates 22 are extracted by cutting (dicing). In other words, the substrate 21 includes the plurality of vibration plates 22. For example, the substrate 21 is made of SUS430 and has an exterior of a quadrangle in a case where the substrate 21 is seen from the Y direction. For example, the size of the substrate 21 is set as a size in which total 28 vibration plates 22 including four vibration plates 22 in the X direction and seven vibration plates in the Z direction may be cut out.

In the substrate 21, the sizes of intervals between the vibration plates 22 adjacent in the X direction and the Z direction are set in accordance with the size of a blade width of a dicing saw, not illustrated. In other words, in the substrate 21, two adjacent vibration plates 22 are cut out (one vibration plate 22 is separated at a time) by cutting between the two vibration plates 22 adjacent in the X direction or the Z direction. An outer edge portion 23 that is positioned on an outer periphery of the substrate 21 and is positioned on an outer side of the plurality (28) of vibration plates 22 is cut off by cutting. The substrate 21 may not include the outer edge portion 23.

Support Unit

The support unit 24 illustrated in FIG. 1 is formed in a rectangular parallelepiped shape that has a rectangular surface having the Z direction as a longitudinal direction and the X direction as a transverse direction in a case where the support unit 24 is seen from the Y direction, and has the Y direction as a height direction. A surface (bottom surface) of the support unit 24 on the –Y side is attached (bonded) to the upper surface 18A of the support 18 using an adhesive, not illustrated. One end portion of the lower surface 22E (refer to FIG. 3C) of the vibration plate 22 on the –X side is bonded to a surface (upper surface) of the support unit 24 on the Y side from the Y side using an adhesive, not illustrated. That is, the support unit 24 indirectly supports the vibration plate 22.

In addition, the support unit 24 includes a plurality of support plates 42 that have the Y direction as a thickness direction and overlap in the Y direction. The support plate 42 is one example of a plate material. While, for example, the support unit 24 is configured by thermally compressing 10 support plates 42 overlapping in the Y direction, only three support plates 42 are illustrated in FIG. 1. A member in a state where 10 support plates 42 overlapping in the Y direction are thermally compressed and the support unit 24 and the weight unit 26 are not separated will be referred to as a support member 44 (refer to FIG. 3A) as one example of one base material. In the present embodiment, for example, the support unit 24 and the weight unit 26 described later are formed by cutting out a part of the support member 44 by cutting.

In a case where the support unit 24 illustrated in FIG. 2A is seen from the Y direction, the support unit 24 is disposed from one end on the –Z side to the other end on the Z side in one end portion of the vibration plate 22 on the –X side.

In addition, surfaces of the support unit 24 on both sides of the support unit 24 in the Z direction and the side surface 22B and the side surface 22D of the vibration plate 22 are aligned with each other along an X-Y plane. The length of the support unit 24 in the X direction is denoted by L4. The length of the support unit 24 in the Z direction is denoted by L3.

Figure 4A:
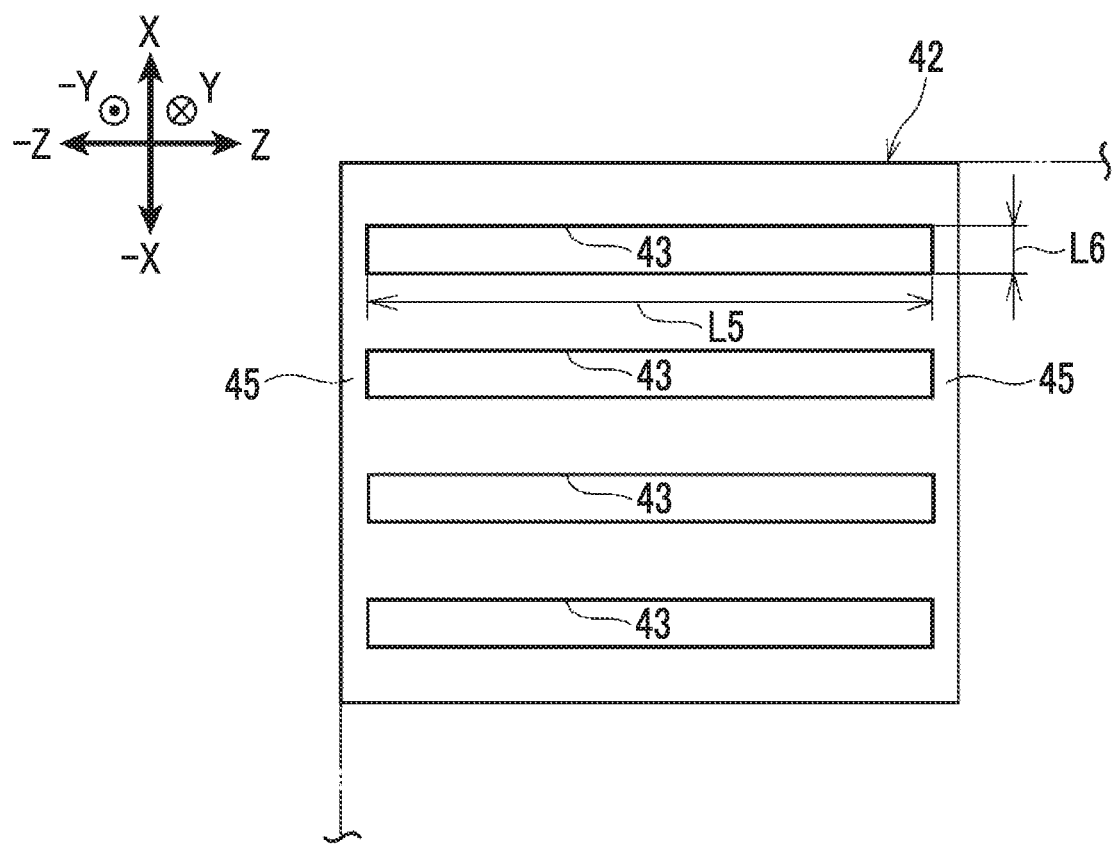
FIG. 4A is a plan view of a support plate according to the first embodiment.

For example, one support plate 42 illustrated in FIG. 4A is made of SUS430 (stainless steel) and has an exterior of a quadrangle in a case where the support plate 42 is seen from the Y direction. In other words, the support member 44 which is an aggregate of the plurality of support plates 42 is formed of a metal material. A stainless material is preferably used as one example of the metal material. In addition, for example, the size of the support plate 42 in the X-Z plane is the same as the size of the substrate 21 (refer to FIG. 2B). For example, the thickness of one support plate 42 in the Y direction is 20 μm. Furthermore, for example, four through holes 43 are formed by etching in the support plate 42. For example, one support plate 42 is obtained by cutting a plate member in which the plurality of support plates 42 are arranged in the X direction and the Z direction using the dicing saw, not illustrated. A substance of the support plate 42 is not particularly restricted (not limited to SUS430).

In a case where the four through holes 43 are seen from the Y direction, for example, each of the four through holes 43 is formed in a rectangular shape having the Z direction as a longitudinal direction and the X direction as a transverse direction. In addition, for example, the four through holes 43 are arranged at equal intervals in the X direction. The four through holes 43 have the same shape and the same size. Thus, one through hole 43 will be described, and descriptions of the other three through holes 43 will not be repeated. The length of the through hole 43 in the Z direction is denoted by L5. For example, the length L5 is a length that is approximately seven times the length L3 (refer to FIG. 2A). The length of the through hole 43 in the X direction is denoted by L6.

Figure 4B:
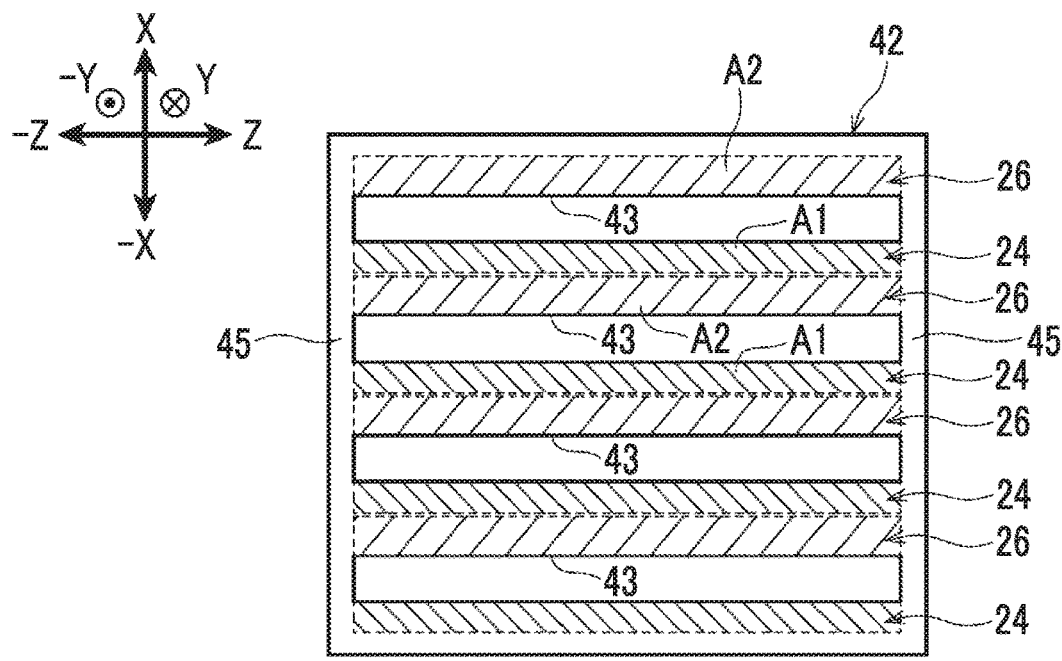
FIG. 4B is a descriptive diagram illustrating a region corresponding to the support unit and a region corresponding to the weight unit in the support plate according to the first embodiment.

For example, a frame unit 45 is formed in outer side end portions in the X direction and the Z direction in the support plate 42 illustrated in FIG. 4B. The frame unit 45 is a portion that connects the support unit 24 and the weight unit 26 before being cut out from the support plate 42. A portion of the support plate 42 on one side (−X side) of the through hole 43 in the X direction is a region A1 that is cut out as the support unit 24. The region A1 is illustrated by diagonal lines.

Weight Unit

The weight unit 26 illustrated in FIG. 1 is formed in a rectangular parallelepiped shape that has a rectangular surface having the Z direction as a longitudinal direction and the X direction as a transverse direction in a case where the weight unit 26 is seen from the Y direction, and has the Y direction as a height direction. One end portion of the lower surface 22E (refer to FIG. 3C) of the vibration plate 22 on the −X side is bonded to a Y side surface (upper surface) of the weight unit 26 from the Y side using an adhesive, not illustrated. Members are not attached to a −Y side surface (bottom surface) of the weight unit 26. The −Y side surface of the weight unit 26 faces the circuit substrate 12 in the Y direction. That is, the weight unit 26 is disposed on a free end side of the vibration plate 22 that is in a cantilevered state by the support 18 and the support unit 24, and may be displaced (vibrate) in the Y direction.

In addition, the weight unit 26 includes the plurality of support plates 42 (support member 44 (refer to FIG. 3A)) that have the Y direction as a thickness direction and are thermally compressed in an overlapping manner in the Y direction. In the present embodiment, for example, the weight unit 26 is formed by cutting out a part of the support member 44 by cutting. That is, a part of the support member 44 is used as the weight unit 26.

The weight unit 26 illustrated in FIG. 2A is disposed from one end on the −Z side to the other end on the Z side in the other end portion of the lower surface 22E (refer to FIG. 3C) of the vibration plate 22 on the X side. In addition, surfaces of the weight unit 26 on both sides of the weight unit 26 in the Z direction and the side surface 22B and the side surface 22D of the vibration plate 22 are aligned with each other along the X-Y plane. The length of the weight unit 26 in the X direction is denoted by L7. In a case where the length L7 is represented using the above lengths L2, L4, and L6 (refer to FIG. 4A), L7=L2−(L4+L6) is established. The length of the weight unit 26 in the Z direction is denoted by L3.

A portion of the support plate 42 illustrated in FIG. 4B on the other side (X side) of the through hole 43 in the X direction is a region A2 that is cut out as the weight unit 26. The region A2 is illustrated by different diagonal lines from the region A1. A portion of the support plate 42 between the through holes 43 adjacent in the X direction is configured with the region A1 and the region A2. An interval between the region A1 and the region A2 is set in accordance with a cutting width of the dicing saw, not illustrated.

Base Unit

For example, the base unit 27 illustrated in FIG. 1 covers (stacked on the upper surface 22F) the upper surface 22F of the vibration plate 22 from the Y side by forming the base unit 27 using a sputtering method. For example, tungsten titanium (TiW) is used in the base unit 27. For example, the thickness of the base unit 27 in the Y direction is 20 nm. The base unit 27 functions as an adhesion layer that increases adhesion between the lower electrode 28 and the vibration plate 22.

Lower Electrode

For example, the lower electrode 28 covers the base unit 27 from the Y side by forming the lower electrode 28 using the sputtering method. In other words, the lower electrode 28 is stacked on the vibration plate 22 through the base unit 27. For example, the lower electrode 28 is formed of iridium (Ir). A well-known precious metal electrode or oxide electrode may be suitably used as a material of the lower electrode 28. For example, the thickness of the lower electrode 28 in the Y direction is 150 nm.

Pad

The pad 32 is disposed in an end portion of the lower electrode 28 on the −X side and is used as a wire bonding pad. One end portion of the bonding wire 19 is bonded to the pad 32. The other end portion of the bonding wire 19 is bonded to the circuit substrate 12.

Piezoelectric Unit

For example, the piezoelectric unit 34 is disposed to cover a center portion of the lower electrode 28 in the X direction to the end portion of the lower electrode 28 on the X side by forming the piezoelectric unit 34 in a plate shape having the Y direction as a thickness direction using the sputtering method. In other words, the piezoelectric unit 34 is disposed in a portion of the vibration plate 22 that is on the opposite side (Y side) from the support unit 24 side (−Y side) in the Y direction (thickness direction). The piezoelectric unit 34 generates power based on a piezoelectric effect in a case where distortion is caused by vibration of the vibration plate 22.

For example, the piezoelectric unit 34 is formed of lead zirconate titanate (PZT) that is a ferroelectric substance. In the present embodiment, for example, in a case where the piezoelectric unit 34 and the support unit 24 are projected to the vibration plate 22 (in the Y direction), the region of the piezoelectric unit 34 and the region of the support unit 24 do not overlap. For example, the thickness of the piezoelectric unit 34 in the Y direction is 5 μm.

Upper Electrode

For example, the upper electrode 36 covers an upper surface of the piezoelectric unit 34 on the −X side from the center of the piezoelectric unit 34 in the X direction by forming the upper electrode 36 using the sputtering method. For example, the upper electrode 36 is formed of Au. For example, the thickness of the upper electrode 36 in the Y direction is 150 nm. One end portion of the bonding wire 19 different from the end portion of the bonding wire 19 bonded to the pad 32 is bonded to the upper electrode 36. The other end portion of the bonding wire 19 is bonded to the circuit substrate 12.

Ball Member

The ball member 16 illustrated in FIG. 1 is arranged between the support unit 24 and the weight unit 26 on the circuit substrate 12. In other words, the ball member 16 is accommodated between the power generation element 20 and the circuit substrate 12 inside the cover member 14. In addition, for example, the ball member 16 is a steel ball having a diameter of a length L8. The length L8 is greater than the length L1 of the interval between the circuit substrate 12 and the weight unit 26. That is, in a case where the ball member 16 is moved from a space portion between the support unit 24 and the weight unit 26 toward a space portion between the circuit substrate 12 and the weight unit 26, it is configured that movement of the weight unit 26 is restricted after the ball member 16 comes into contact with the weight unit 26. Furthermore, in a case where an external force in the Y direction is exerted on the power generation apparatus 10 (in a case where the power generation apparatus 10 vibrates), the ball member 16 comes into contact with the vibration plate 22 from the −Y side. While the contact member in the present embodiment is represented as having a spherical shape as one example of the shape of the contact member, the contact member does not necessarily need to have a ball shape (spherical shape) as long as a configuration of the contact member satisfies the above concept. For example, the contact member may have a shape of a weight that includes a cylindrical main body portion and a spherical shape protruding portion formed on an upper surface of the main body portion. By including the main body portion, mass that is necessary as the contact member may be secured. By including the spherical shape protruding portion, the contact member may be brought into contact with the vibration plate 22 at a point.

Effect

Next, a method of manufacturing the power generation element 20 of the first embodiment, an effect of the power generation apparatus 10, and an effect of the power generation element 20 will be described.

Method of Manufacturing Power Generation Element

Figure 3A:
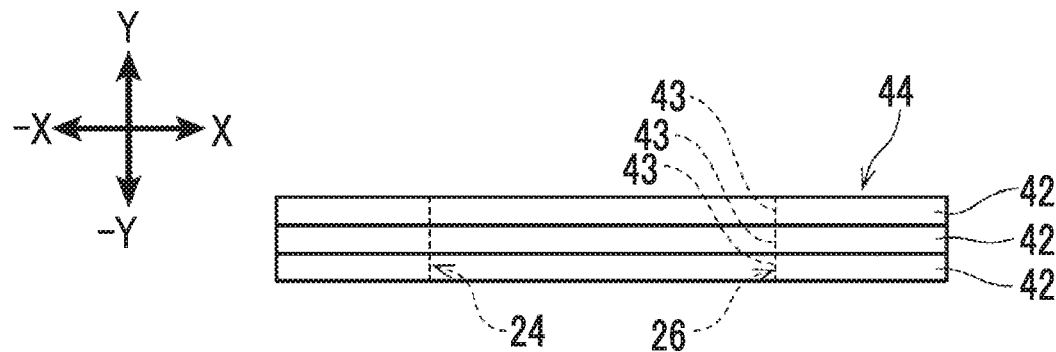
FIG. 3A is a descriptive diagram of a support unit and a weight unit according to the first embodiment.

The through hole 43 is formed by etching for each support plate 42 illustrated in FIG. 3A. The support member 44 (including the support unit 24 and the weight unit 26) is formed by thermally compressing (bonding) the plurality of support plates 42 in an overlapping manner in the Y direction in a state where hole wall surfaces of the through holes 43 are aligned. The support member 44 of one unit is obtained by cutting the support member 44 in the thickness direction using the dicing saw, not illustrated. For example, the support member 44 of one unit includes four support units 24 and four weight units 26 (refer to FIG. 4B). That is, the support unit 24 and the weight unit 26 are extracted as a single unit from one support member 44.

Figure 3B:
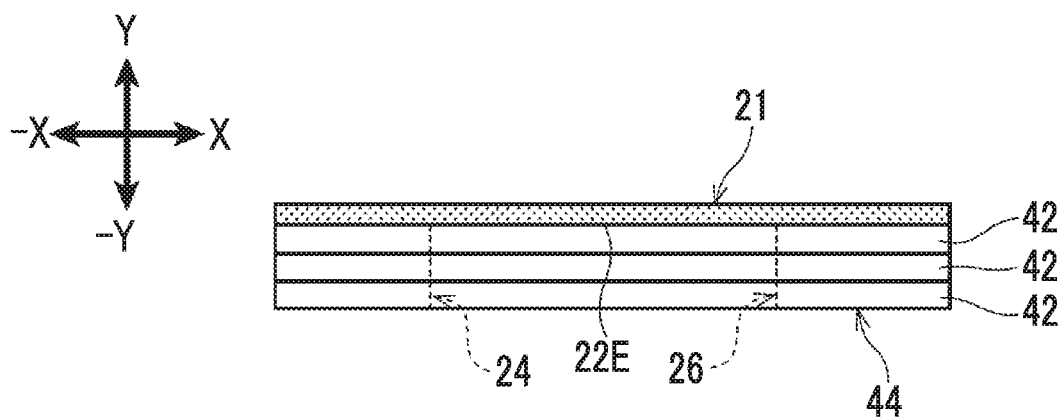
FIG. 3B is a descriptive diagram illustrating a state where the support unit and the weight unit according to the first embodiment are attached to a vibration plate.
Figure 5A:
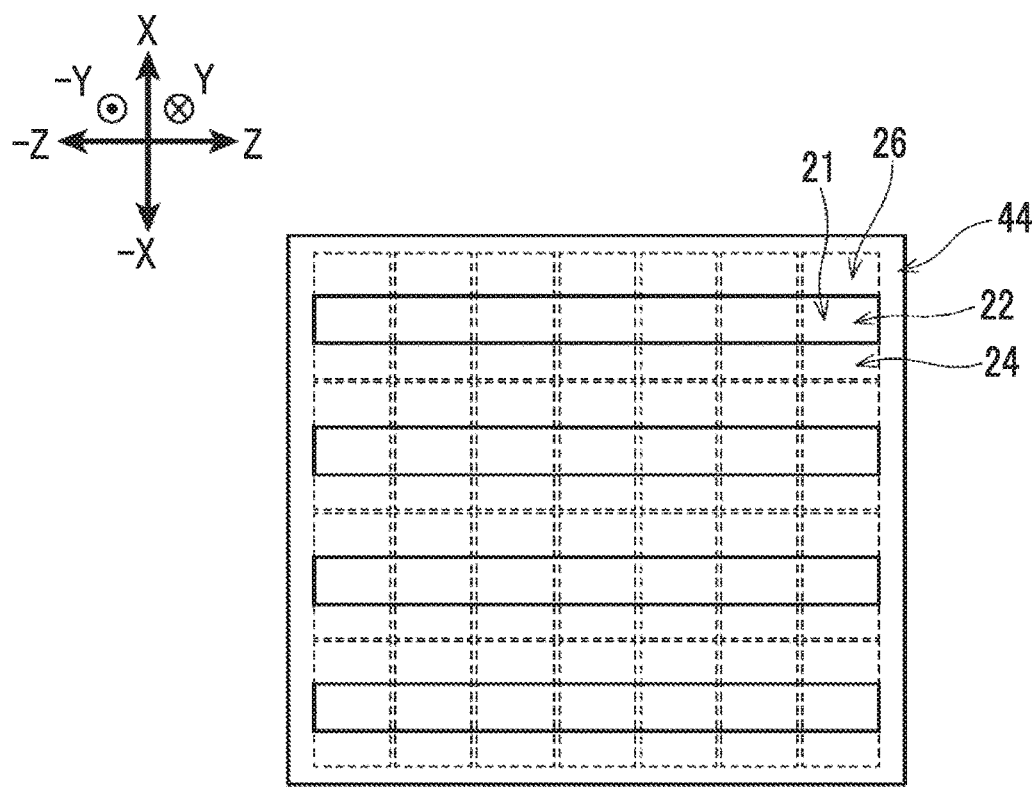
FIG. 5A is a descriptive diagram in which a state where a support member is attached to the substrate according to the first embodiment is seen from a support member side.

The support member 44 illustrated in FIG. 3B is bonded to the lower surface 22E of the substrate 21 using an adhesive or the like, not illustrated. In other words, in the substrate 21 illustrated in FIG. 5A, the support unit 24 is disposed in one end portion (−X side end portion) of the vibration plate 22 in the X direction, and the weight unit 26 is disposed in the other end portion (X side end portion) of the vibration plate 22 in the X direction (one example of a first step).

Figure 3C:
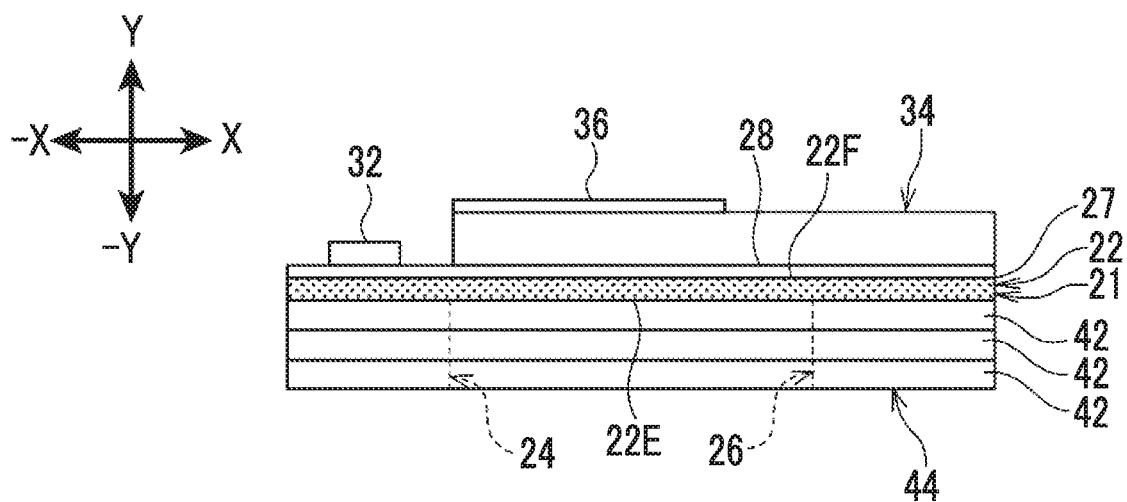
FIG. 3C is a descriptive diagram illustrating a state where a piezoelectric unit is disposed in the vibration plate according to the first embodiment.

After the support member 44 is bonded to the substrate 21 illustrated in FIG. 3C (the support unit 24 and the weight unit 26 are disposed in the vibration plate 22), the lower electrode 28 and the pad 32 are disposed on the upper surface 22F of the vibration plate 22 through the base unit 27. Furthermore, the piezoelectric unit 34 is disposed in the lower electrode 28 using the sputtering method. In other words, the piezoelectric unit 34 is disposed in a portion of the vibration plate 22 that is on the opposite side from the support unit 24 side in the Y direction (one example of a second step). The upper electrode 36 is formed on a part of the surface of the piezoelectric unit 34 on the Y side (the opposite side from a lower electrode 28 side in the Y direction) using the sputtering method.

Figures 5B, 6:
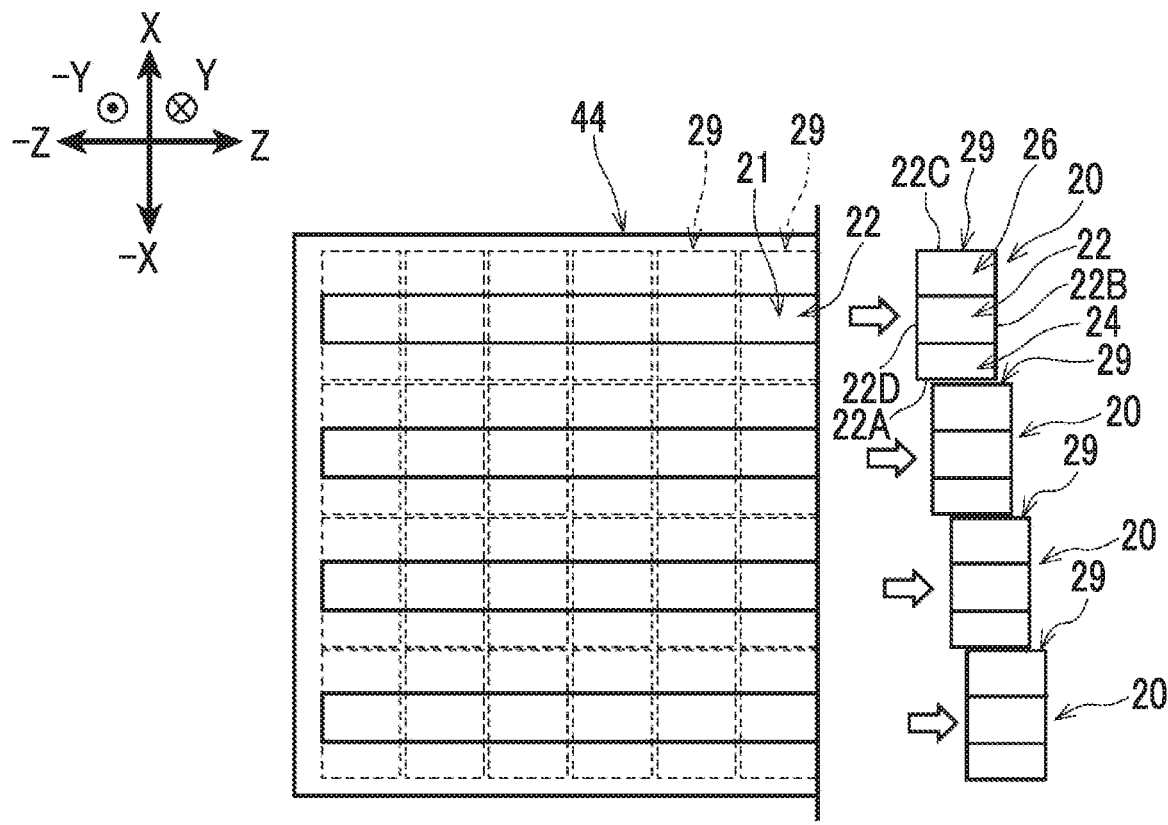
FIG. 5B is a descriptive diagram illustrating a state where the power generation element is cut out by cutting from the substrate according to the first embodiment.
FIG. 6 is a table showing a relationship between the thickness of the vibration plate and a warping evaluation of the vibration plate according to the first embodiment.

In the substrate 21 and the support member 44 illustrated in FIG. 5B, after the piezoelectric unit 34 (refer to FIG. 3C) is disposed in the vibration plate 22, an outer edge 29 of the vibration plate 22 is cut in the Y direction using the dicing saw, not illustrated. The outer edge 29 means a portion that corresponds to an exterior line in a case where the vibration plate 22 is seen from the Y direction. Specifically, the outer edge 29 is configured with the side surface 22A, the side surface 22B, the side surface 22C, and the side surface 22D (refer to FIG. 2A). By cutting the outer edge 29 of the vibration plate 22 and the support member 44, a plurality of power generation elements 20 are extracted from the substrate 21 and the support member 44 (one example of a third step). In other words, one unit of the support unit 24 and the weight unit 26 disposed in the vibration plate 22 is divided at a time by cutting of the support member 44 accompanied by cutting of the outer edge 29.

Figure 3D:
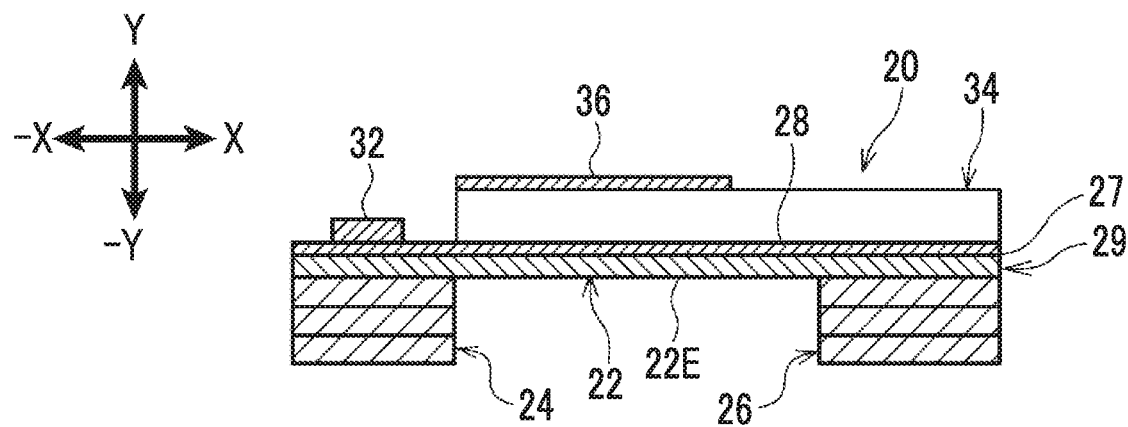
FIG. 3D is a descriptive diagram illustrating a state where a piezoelectric element according to the first embodiment is cut out.

In the power generation element 20 illustrated in FIG. 3D, the outer edge 29 of the vibration plate 22, side surfaces and a lower surface of the support unit 24, and side surfaces and a lower surface of the weight unit 26 are exposed. Exposure of the vibration plate 22, the support unit 24, and the weight unit 26 means that a side surface that is substantially cut off by cutting and is in an intersection direction intersecting with the thickness direction is exposed to an outer side. The word "substantially" means that a case where the side surface that is cut off is covered with a coating agent, not illustrated, is also included. In other words, the outer edge 29, the support unit 24, and the weight unit 26 are not surrounded by other members in the X direction and the Z direction in a case where the outer edge 29, the support unit 24, and the weight unit 26 are seen from the Y direction.

The support unit 24 of the power generation element 20 illustrated in FIG. 1 is attached to the support 18 disposed in advance in the circuit substrate 12 using an adhesive, not illustrated. The pad 32 and the upper electrode 36 are connected to the circuit substrate 12 through different bonding wires 19. Furthermore, the power generation element 20 is covered with the cover member 14 in a state where the ball member 16 is arranged in a space portion between the support 18 and the weight unit 26. The power generation apparatus 10 is finished by covering the power generation element 20 with the cover member 14.

As described thus far, in the method of manufacturing the power generation element 20, the piezoelectric unit 34 is disposed in a portion of the vibration plate 22 on the opposite side from the support unit 24 side in the Y direction (thickness direction) in a state where the support unit 24 and the weight unit 26 are disposed in the vibration plate 22 of the substrate 21. In a case where internal stress is caused in the vibration plate 22 by disposing the piezoelectric unit 34, the support unit 24 and the weight unit 26 resist deformation of the vibration plate 22 caused by the internal stress. By the support unit 24 and the weight unit 26 resisting the deformation of the vibration plate 22 caused by the internal stress, warping of the vibration plate 22 is suppressed. Thus, the thickness of the vibration plate 22 may be decreased compared to the thickness of the vibration plate 22 in a method of disposing the piezoelectric unit 34 in the vibration plate 22 before disposing the support unit 24 and the weight unit 26 in the vibration plate 22. In other words, even in a case where the thickness of the vibration plate 22 is decreased, warping of the vibration plate 22 in a case where the piezoelectric unit 34 is disposed is suppressed.

Furthermore, in the method of manufacturing the power generation element 20, the power generation element 20 is extracted from the substrate 21 by cutting the outer edge 29 of the vibration plate 22. Thus, in a case where the substrate 21 includes the plurality of vibration plates 22, the vibration plates 22 adjacent in the X direction and the Z direction may be gathered. By gathering the adjacent vibration plates 22, the number of power generation elements 20 acquired from the substrate 21 may be increased compared to the number of power generation elements 20 in a case where a frame unit is disposed around the vibration plate 22. That is, according to the method of manufacturing the power generation element 20, the thickness of the vibration plate 22 may be decreased, and the number of power generation elements 20 acquired from the substrate 21 may be increased.

In addition, in the method of manufacturing the power generation element 20, the support unit 24 and the weight unit 26 are extracted as a single unit from the support member 44 and are disposed in the vibration plate 22. That is, the support unit 24 and the weight unit 26 may be collectively disposed in the vibration plate 22. Thus, a work of disposing the support unit 24 and the weight unit 26 in the vibration plate 22 may be simply performed.

Furthermore, in the method of manufacturing the power generation element 20, the mass of the weight unit 26 is changed by changing the number of overlapping support plates 42 in the weight unit 26. Thus, the mass of the weight unit 26 may be simply adjusted compared to the mass of the weight unit 26 in a method of adjusting the mass by replacing the whole weight unit 26.

In addition, in the method of manufacturing the power generation element 20, the support unit 24 and the weight unit 26 are formed by thermally compressing the plurality of support plates 42 in the Y direction. In other words, the plurality of support plates 42 do not need to be bonded using an adhesive. Thus, a work of applying an adhesive between the plurality of support plates 42 may be omitted. In addition, an organic based adhesive causes a problem of heat resistance or gas generation in a subsequent step. However, in the method of manufacturing the power generation element 20, the support plates 42 made of metal are thermally compressed. Thus, the problem of heat resistance and gas generation may be resolved. That is, it is preferable to form the support unit 24 and the weight unit 26 using only an inorganic material.

Effect of Power Generation Element

In the power generation element 20 illustrated in FIG. 1, the support unit 24 and the weight unit 26 are disposed from one end to the other end of the transverse direction of a portion of the vibration plate 22 on the opposite side from the piezoelectric unit 34 side in the Y direction (thickness direction). In a case where internal stress is caused in the vibration plate 22 by disposing the piezoelectric unit 34 in the vibration plate 22, the support unit 24 and the weight unit 26 resist deformation of the vibration plate 22 caused by the internal stress. That is, by the support unit 24 and the weight unit 26 resisting the deformation of the vibration plate 22 on the Y side (exerting a force directed toward the −Y side), warping of the vibration plate 22 is suppressed. Thus, the thickness of the vibration plate 22 may be decreased compared to the thickness of the vibration plate 22 in a case where the weight unit 26 is disposed in a part of the vibration plate 22 in the Z direction.

Furthermore, in the power generation element 20, the side surface 22A, the side surface 22B, the side surface 22C, and the side surface 22D of the vibration plate 22 in the X direction and the Z direction are exposed. In other words, other members or portions are not disposed around the vibration plate 22. Thus, in a case where the plurality of vibration plates 22 are formed in one substrate 21, the adjacent vibration plates 22 may be gathered. By gathering the adjacent vibration plates 22, the number of power generation elements 20 acquired from the substrate 21 may be increased.

In addition, in the power generation element 20, for example, the thickness of the vibration plate 22 is 20 μm. In other words, the thickness of the vibration plate 22 is selected within a range of greater than or equal to 10 μm and less than or equal to 100 μm. Thus, the vibration plate 22 vibrates in the Y direction more easily than the vibration plate 22 in a case where the thickness of the vibration plate 22 is greater than 100 μm, and power generation efficiency of the power generation element 20 may be increased.

An evaluation result of a warping state of the vibration plate 22 in a case where the piezoelectric unit 34 is disposed after the support unit 24 and the weight unit 26 are disposed in the vibration plate 22 is shown in FIG. 6. FIG. 1 will be referred to for each member. The thickness of the vibration plate 22 is 20 μm, 50 μm, 100 μm, or 120 μm. For example, the piezoelectric unit 34 is disposed in the vibration plate 22 under a condition that a film deposition pressure is 2.2 mTorr and a film deposition temperature is 600° C. A warping amount of the vibration plate 22 is obtained as a difference between the height of the −X side end of the vibration plate 22 in the Y direction and the height of the X side end of the vibration plate 22 in the Y direction. In addition, the warping amount of the vibration plate 22 is evaluated such that a case where the warping amount is greater than 50 μm is rank A, a case where the warping amount is greater than or equal to 50 μm and less than or equal to 200 μm is rank B, and a case where the warping amount is greater than 200 μm is rank C. The cases of rank A and rank B do not have manufacturing problems. Meanwhile, in the case of rank C, the warping amount is significant. Thus, it is difficult to perform manufacturing in a step after the piezoelectric unit 34 is disposed.

As an evaluation result, a case where the thickness of the vibration plate 22 is 20 μm is rank A, and a case where the thickness of the vibration plate 22 is 50 μm is rank B. A case where the thickness of the vibration plate 22 is 100 μm is rank B, and a case where the thickness of the vibration plate 22 is 120 μm is rank C. That is, it is preferable to select the thickness of the vibration plate 22 within a range of greater than or equal to 10 μm and less than or equal to 100 μm.

In addition, in the power generation element 20 illustrated in FIG. 1, the weight unit 26 includes the plurality of support plates 42 overlapping in the Y direction (thickness direction). In other words, the mass of the weight unit 26 is changed by changing the number of support plates 42 in the weight unit 26. Thus, the mass of the weight unit 26 may be simply adjusted compared to the mass of the weight unit 26 in a case where the weight unit 26 is configured with one block.

Furthermore, in the power generation element 20, the support unit 24 includes the plurality of support plates 42 overlapping in the Y direction (thickness direction). In other words, the support unit 24 is configured with the same member as the weight unit 26. That is, the support unit 24 and the weight unit 26 are formed by arranging the same support plates 42 in an overlapping manner and are collectively disposed in the vibration plate 22. Thus, a work of disposing the support unit 24 and the weight unit 26 in the vibration plate 22 may be simply performed compared to the work in a case where the support unit 24 and the weight unit 26 are formed as separate members.

Effect of Power Generation Apparatus

In the power generation apparatus 10 illustrated in FIG. 1, the vibration plate 22 vibrates based on at least one effect of transmitting vibration of the circuit substrate 12 to the vibration plate 22 through the support 18 and the support unit 24 or bringing the ball member 16 into contact with the vibration plate 22. In a case where distortion is caused in the piezoelectric unit 34 by vibration of the vibration plate 22, electric charges are obtained from the lower electrode 28 and the upper electrode 36 through the bonding wires 19 based on a piezoelectric effect of the piezoelectric unit 34. That is, power is generated in the power generation apparatus 10. The power obtained in the power generation apparatus 10 is consumed in the circuit substrate 12 or is stored in a battery, not illustrated.

Specifically, in the power generation apparatus 10, since the thickness of the vibration plate 22 in the power generation element 20 may be decreased, the vibration plate 22 easily vibrates. Furthermore, by bringing the ball member 16 into contact with the vibration plate 22, the vibration plate 22 may be forced to vibrate. That is, power generation efficiency of the power generation apparatus 10 may be increased compared to the power generation efficiency of the power generation apparatus 10 not including the power generation element 20.

In addition, in the power generation apparatus 10, the length L8 of the diameter of the ball member 16 is greater than the length L1 of the interval between the circuit substrate 12 and the weight unit 26 in the Y direction. Furthermore, the ball member 16 is arranged between the support unit 24 and the weight unit 26. In other words, even in a case where the weight unit 26 side (X side) of the vibration plate 22 is displaced to the Y side, the ball member 16 is easily brought into contact with the weight unit 26. By easily bringing the ball member 16 into contact with the weight unit 26, the ball member 16 is unlikely to escape to the outer side from between the support unit 24 and the weight unit 26, and the number of opportunities of contact between the ball member 16 and the vibration plate 22 is increased. Thus, the power generation efficiency of the power generation apparatus 10 may be increased.

Example

An example of the power generation apparatus 10 of the present embodiment and a first comparative example and a second comparative example for the example will be described. FIG. 1 will be referred to for each member.

As an example of the power generation apparatus 10, the substrate 21 is formed by thermally compressing a plurality of SUS430 (stainless steel) plates in which through holes are formed (framed) by etching in an overlapping manner in the thickness direction and bonding the plurality of SUS430 plates to a SUS430 plate having a thickness of 20 μm using an adhesive. The size of the SUS430 plate is 5 cm square. Next, an Ir electrode having a thickness of 150 nm is formed on the substrate 21 through TiW having a thickness of 20 μm using the sputtering method. Furthermore, the piezoelectric unit 34 made of PZT is formed by heating the substrate 21 to 600° C.

After the piezoelectric unit 34 is formed, a part of the piezoelectric unit 34 is cut by machine, and the lower electrode 28 is extracted. After the lower electrode 28 is extracted, the upper electrode 36 is formed on the piezoelectric unit 34. The power generation element 20 is extracted from the substrate 21 by cutting a portion of the substrate 21 corresponding to the outer edge 29 of the vibration plate 22 using the dicing saw. The support unit 24 and the weight unit 26 are formed by cutting. The obtained power generation element 20 is attached to the support 18 of the circuit substrate 12. Then, wire bonding is performed to the upper electrode 36 and the lower electrode 28, and the electrodes are extracted outside. Furthermore, the ball member 16 is arranged between the vibration plate 22 and the circuit substrate 12 and is covered with the cover member 14. Thus, the power generation apparatus 10 of the example is obtained. In the power generation apparatus 10 of the example, a resonance frequency is 150 Hz, and preferred vibration characteristics are obtained.

First Comparative Example

As a first comparative example for the power generation apparatus 10, the lower electrode 28 is formed in the 5 cm square SUS430 substrate 21 having a thickness of 20 μm without disposing the support unit 24 and the weight unit 26.

Then, the piezoelectric unit 34 made of PZT is formed at a temperature of 600° C. The obtained substrate 21 significantly warps upward to one side in the thickness direction, and it is difficult to form the upper electrode 36.

Second Comparative Example

As a second comparative example for the power generation apparatus 10, the lower electrode 28 is formed in the 5 cm square SUS430 substrate 21 having a thickness of 100 μm without disposing the support unit 24 and the weight unit 26. Then, the piezoelectric unit 34 made of PZT is formed at a temperature of 600° C. The obtained substrate 21 has a smaller warping amount than the substrate 21 of the first comparative example. Thus, the upper electrode 36 may be formed. Next, patterning is performed on a rear surface of the substrate 21, and then, a part of the substrate 21 is removed by wet etching using iron(III) chloride. The etching is isotropic and has low accuracy.

In the etched substrate 21, an etching stopper layer is not present. Thus, in order to stop the etching at a preset depth, time management is required, and a work becomes complicated. Furthermore, a difference between the preset depth and an obtained depth is significant. Next, the obtained power generation element is attached to the support 18 of the circuit substrate 12. Then, wire bonding is performed to the upper electrode 36 and the lower electrode 28, and the electrodes are extracted outside. Furthermore, the ball member 16 is arranged between the vibration plate 22 and the circuit substrate 12 and is covered with the cover member 14. Thus, the power generation apparatus of the second comparative example is obtained. In the power generation apparatus of the second comparative example, the resonance frequency is increased compared to the resonance frequency in the power generation apparatus 10 of the example.

Second Embodiment

Next, one example of a method of manufacturing a power generation element, a power generation element, and a power generation apparatus according to a second embodiment will be described. The same configurations as the first embodiment will be designated by the same reference signs as the first embodiment, and descriptions of such configurations will not be repeated. In addition, a description of the same method as the first embodiment will not be repeated.

Figure 7:
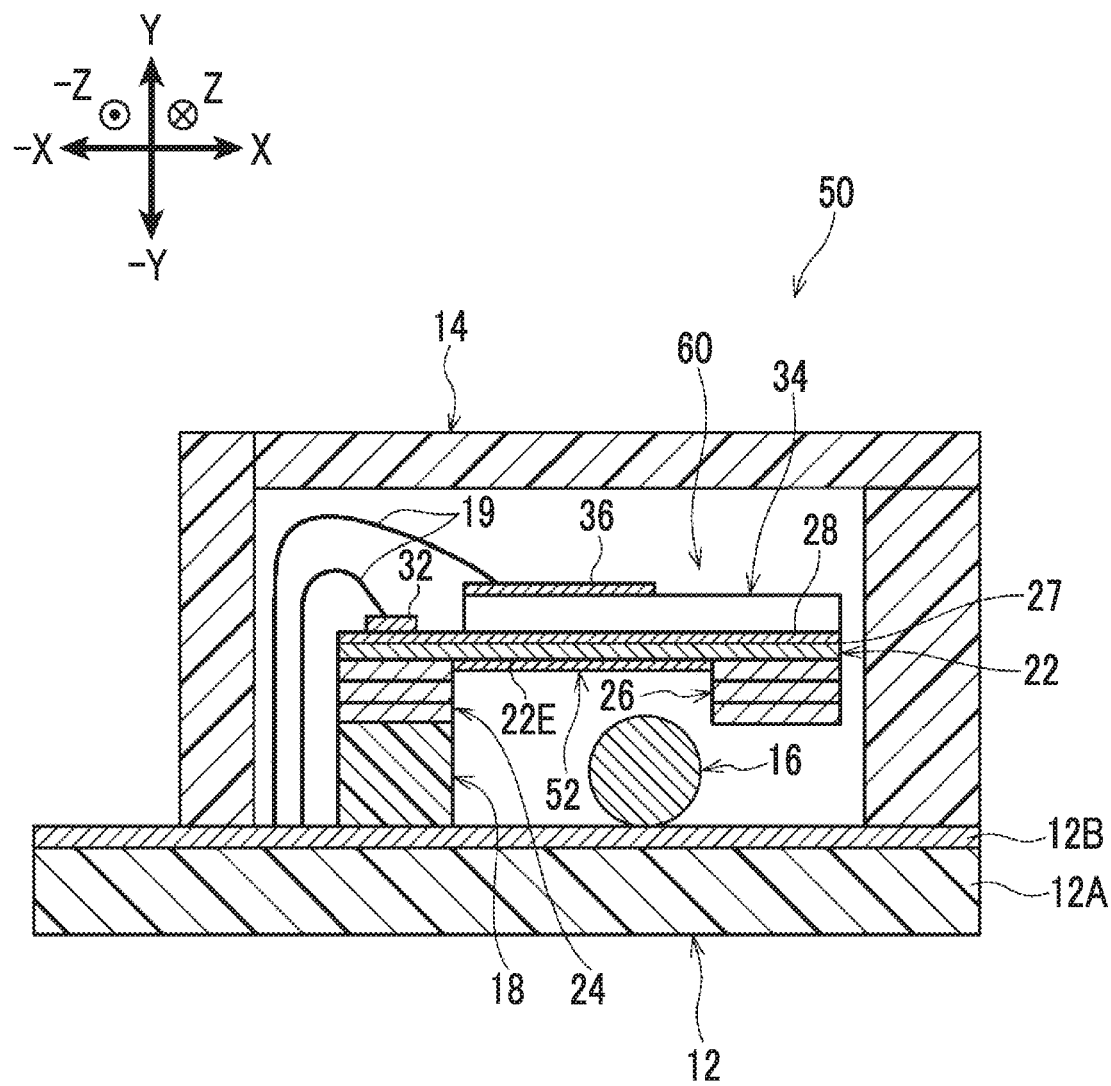
FIG. 7 is a configuration diagram of a power generation apparatus according to a second embodiment.

FIG. 7 illustrates a power generation apparatus 50 as a second embodiment of the present disclosure. For example, the power generation apparatus 50 includes a power generation element 60, the circuit substrate 12, the cover member 14, the ball member 16, the support 18, the bonding wire 19, and a stress adjustment unit 52 as one example of a reinforcing unit. That is, the power generation apparatus 50 is configured by adding the stress adjustment unit 52 to the power generation apparatus 10 (refer to FIG. 1). In the power generation element 60, the support unit 24 and the weight unit 26 are disposed at an interval in the X direction on the lower surface 22E of the vibration plate 22 on the opposite side from the piezoelectric unit 34 side in the Y direction.

Stress Adjustment Unit

For example, the stress adjustment unit 52 is disposed on the lower surface 22E between the support unit 24 and the weight unit 26 by forming the stress adjustment unit 52 in a plate shape having the Y direction as a thickness direction using the sputtering method. That is, the stress adjustment unit 52 reinforces the vibration plate 22 by covering a portion of the vibration plate 22 on the opposite side (−Y side) from the piezoelectric unit 34 side (Y side) in the Y direction (thickness direction) from the −Y side. In other words, by disposing the stress adjustment unit 52, rigidity of the vibration plate 22 against a force exerted in the Y direction is increased compared to the rigidity in a case where the stress adjustment unit 52 is not present.

For example, the stress adjustment unit 52 is formed of $TiO_2$ that has a thermal expansion coefficient less than a thermal expansion coefficient of SUS430 described above. In addition, in the present embodiment, for example, in a case where the stress adjustment unit 52 is seen from the Z direction, the stress adjustment unit 52 is disposed from the position of an X side end of the support unit 24 to the position of a −X side end of the weight unit 26 across the whole width of the support plate 42 in the Z direction. For example, the thickness of the stress adjustment unit 52 in the Y direction is 100 nm.

Effect

Next, a method and an effect of manufacturing the power generation element 60 of the second embodiment will be described.

In the method of manufacturing the power generation element 60, a step of manufacturing the stress adjustment unit 52 is added to the method of manufacturing the power generation apparatus 10 (refer to FIG. 1). Specifically, a step of disposing the stress adjustment unit 52 ($TiO_2$) having a thickness of 100 nm on the lower surface 22E between the support unit 24 and the weight unit 26 using the sputtering method before the piezoelectric unit 34 is disposed in the vibration plate 22 is added. After the stress adjustment unit 52 is disposed, the piezoelectric unit 34 is disposed in the vibration plate 22. Furthermore, the lower electrode 28 is extracted, and the upper electrode 36 is formed. The power generation element 60 is extracted by cutting the substrate 21 using the dicing saw, not illustrated.

In the power generation element 60, in a case where the vibration plate is about to deform in a warping direction by disposing the piezoelectric unit 34 in the vibration plate 22 at 600° C., the stress adjustment unit 52 disposed in the vibration plate 22 on the opposite side from the piezoelectric unit 34 side in the Y direction resists deformation of the vibration plate 22. That is, the power generation element 60 may suppress deformation (warping) of the vibration plate 22 in a case where the piezoelectric unit 34 is disposed in the vibration plate 22, compared to a configuration in which the stress adjustment unit 52 is not present.

In the power generation apparatus 50, by suppressing deformation of the vibration plate 22 in the power generation element 60, shifting of an initial position of the vibration plate 22 to the Y side or the −Y side is suppressed. By suppressing shifting of the initial position of the vibration plate 22 to the Y side or the −Y side, a vibration state of the vibration plate 22 is stabilized. Thus, the power generation apparatus 50 may suppress a decrease in power generation efficiency compared to a configuration in which the initial position of the vibration plate 22 is shifted to the Y side or the −Y side.

The present disclosure is not limited to the embodiments.

Modification Example

Figure 8:
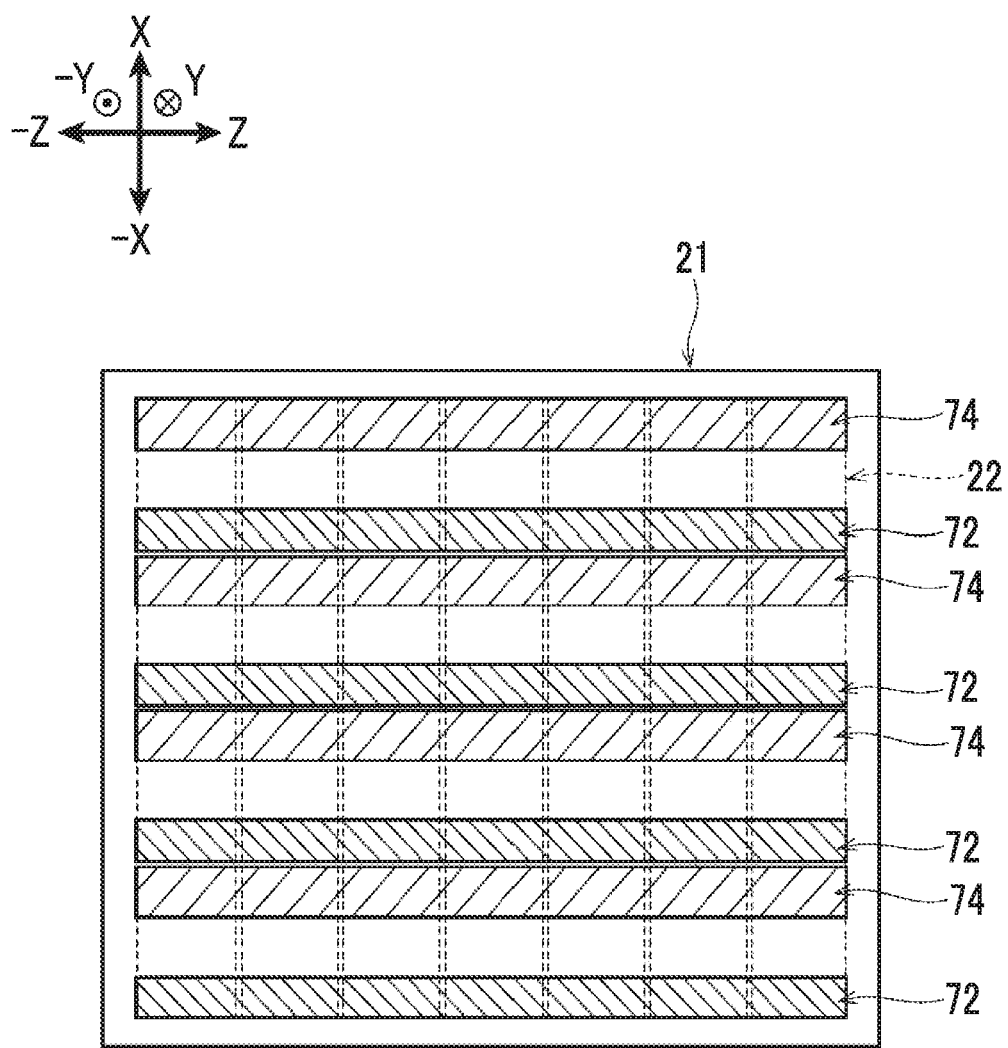
FIG. 8 is a descriptive diagram illustrating a state where a support unit and a weight unit are attached to a substrate according to a modification example.

FIG. 8 illustrates a support unit 72 and a weight unit 74 of a modification example disposed in the substrate 21. The support unit 72 and the weight unit 74 are different from the support unit 24 and the weight unit 26 (refer to FIG. 4B) in that the support unit 72 and the weight unit 74 are not extracted as a single unit from the support member 44 (refer to FIG. 4B) and are separately disposed in the substrate 21. In a case where the support unit 72 is seen from the Y direction (thickness direction), the support unit 72 has the same shape and the same size as the support unit 24. In addition, for example, the support unit 72 is formed by thermally compressing a plurality of SUS430 plate materials in an overlapping manner in the Y direction.

In a case where the weight unit 74 is seen from the Y direction (thickness direction), the weight unit 74 has the same shape and the same size as the weight unit 26. In addition, for example, the weight unit 74 is formed by thermally compressing a plurality of SUS430 plate materials in an overlapping manner in the Y direction. The formed support unit 72 is attached (disposed) to the substrate 21 using an adhesive. The formed weight unit 74 is attached (disposed) to the substrate 21 at an interval with the support unit 72 in the X direction using an adhesive. The weight unit 74 is disposed in the substrate 21 as a separate unit from the support unit 72. Thus, the thickness (mass) of the weight unit 74 may be freely adjusted. The support unit 72 and the weight unit 74 have sizes corresponding to the vibration plate 22 by cutting the support unit 72 and the weight unit 74 using the dicing saw, not illustrated.

Other Modification Examples

A method of forming the support unit 24, the weight unit 26, the support unit 72, or the weight unit 74 is not limited to a method of bonding a plurality of plate materials in an overlapping manner in the thickness direction and may be a method of using one member. In addition, the method of forming the support unit 24, the weight unit 26, the support unit 72, or the weight unit 74 is not limited to a bonding method of thermally compressing a plurality of plate materials in an overlapping manner in the thickness direction and may be a bonding method of bonding a plurality of plate materials using an adhesive.

In addition, as another example (an example other than thermal compression) of the bonding method, diffusion bonding or a eutectic may be used. The diffusion bonding is a method of bonding using diffusion of atoms occurring between bonding surfaces by causing members (base materials) to adhere and applying a pressure to an extent not causing plastic deformation as far as possible under a temperature condition of less than or equal to melting points of the members. The eutectic is a mixture of crystals of two or more types that are crystallized at the same time from a liquid including two or more components.

The vibration plate 22 is not limited to SUS430, and a member made of another metal may be used. In addition, the thickness of the vibration plate 22 may be greater than 100 μm. Furthermore, the vibration plate 22 is not limited to a rectangular shape configuration in a case where the vibration plate 22 is seen from the thickness direction. The vibration plate 22 may have a trapezoidal shape in which a length on the X side in the Z direction or a length on the −X side in the Z direction is greater than the other.

Each of the support unit 24 and the support unit 72 may be configured with one member. In addition, the support unit 24 and the support unit 72 are not limited to SUS430, and members made of another metal may be used. Furthermore, the support unit 24 and the support unit 72 are not limited to a rectangular shape configuration in a case where the support unit 24 and the support unit 72 are seen from the thickness direction. The support unit 24 and the support unit 72 may have a trapezoidal shape in which a length on the X side in the Z direction or a length on the −X side in the Z direction is greater than the other. Furthermore, the support unit 24 and the support unit 72 may be disposed in the vibration plate 22 at intervals in the Z direction as a plurality of island units and may not be configured to be cut in a case where the vibration plate 22 is cut.

Each of the weight unit 26 and the weight unit 74 may be configured with one member. In addition, the weight unit 26 and the weight unit 74 are not limited to a configuration in which the weight unit 26 and the weight unit 74 are disposed on only the −Y side (support unit 24 side) of the vibration plate 22 in the Y direction. The weight unit 26 and the weight unit 74 may be disposed on the −Y side and the Y side of the vibration plate 22 in the Y direction. Furthermore, the weight unit 26 and the weight unit 74 are not limited to SUS430, and members made of another metal may be used. In addition, the weight unit 26 and the weight unit 74 are not limited to a rectangular shape configuration in a case where the weight unit 26 and the weight unit 74 are seen from the thickness direction. The weight unit 26 and the weight unit 74 may have a trapezoidal shape in which a length on the X side in the Z direction or a length on the −X side in the Z direction is greater than the other. In addition, the weight unit 26 and the weight unit 74 may be disposed in the vibration plate 22 at intervals in the Z direction as a plurality of island units and may not be configured to be cut in a case where the vibration plate 22 is cut.

The piezoelectric unit 34 may be configured with a member of other than PZT as long as the member is made of a piezoelectric material. For example, aluminum nitride (AlN) or zinc oxide (ZnO), or an additive may be further included.

The stress adjustment unit 52 is not limited to $TiO_2$ and may be formed of IrOx or Ti, or the same material as the vibration plate 22.

In the power generation apparatus 10 and the power generation apparatus 50, the length L8 of the diameter of the ball member 16 may be greater than or less than the length of the interval between the circuit substrate 12 and the weight unit 26 or the weight unit 74. The contact member that comes into contact with the vibration plate 22 is not limited to a ball and may have an exterior of a polyhedron having a polygonal shape or an ellipsoid in a case where the contact member is seen from one direction.

The entire disclosure of Japanese Patent Application No. 2017-198384 filed on Oct. 12, 2017 is incorporated in the present specification by reference. All documents, patent applications, and technical standards disclosed in the present specification are incorporated in the present specification by reference to the same extent as in a case where each of the documents, patent applications, and technical standards is specifically and individually indicated to be incorporated by reference.

What is claimed is:
1. A power generation apparatus comprising:
the power generation element that comprises
a vibration plate that is formed to be deformable in a thickness direction and in which side surfaces in a longitudinal direction and a transverse direction intersecting with the thickness direction are exposed;
a support unit that is disposed from one end to the other end of the transverse direction in one end portion of the vibration plate in the longitudinal direction and supports the vibration plate;

a piezoelectric unit that is disposed in a portion of the vibration plate on an opposite side from the support unit side in the thickness direction and generates power due to vibration of the vibration plate; and a weight unit that is disposed from one end to the other end of the transverse direction in the other end portion of the vibration plate in the longitudinal direction;

a circuit substrate in which an attachment unit to which the support unit is attached is disposed;

an accommodation member that is formed in a hollow box shape, is disposed in the circuit substrate, and accommodates the power generation element inside the accommodation member; and a contact member that is accommodated between the power generation element and the circuit substrate inside the accommodation member and comes into contact with the vibration plate;

wherein the contact member is formed in a spherical shape and is arranged between the support unit and the weight unit, and a length of a diameter of the contact member is greater than a length of an interval between the circuit substrate and the weight unit.

\* \* \* \* \*